United States Patent
Cheng et al.

(10) Patent No.: US 9,343,550 B2
(45) Date of Patent: May 17, 2016

(54) SILICON-ON-NOTHING FINFETS

(71) Applicant: GLOBALFOUNDRIES Inc., Grand Cayman (KY)

(72) Inventors: Kangguo Cheng, Schenectady, NY (US); Ali Khakifirooz, Los Altos, CA (US); Alexander Reznicek, Troy, NY (US); Dominic J. Schepis, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/666,469

(22) Filed: Mar. 24, 2015

(65) Prior Publication Data
US 2015/0194507 A1 Jul. 9, 2015

Related U.S. Application Data

(63) Continuation of application No. 14/031,502, filed on Sep. 19, 2013, now Pat. No. 9,041,062.

(51) Int. Cl.
| | |
|---|---|
| *H01L 29/66* | (2006.01) |
| *H01L 27/12* | (2006.01) |
| *H01L 21/84* | (2006.01) |
| *H01L 21/8234* | (2006.01) |
| *H01L 21/306* | (2006.01) |
| *H01L 21/762* | (2006.01) |
| *H01L 29/78* | (2006.01) |
| *H01L 29/165* | (2006.01) |

(52) U.S. Cl.
CPC .... *H01L 29/66795* (2013.01); *H01L 21/30604* (2013.01); *H01L 21/7624* (2013.01); *H01L 21/823431* (2013.01); *H01L 21/845* (2013.01); *H01L 27/1211* (2013.01); *H01L 29/785* (2013.01); *H01L 29/165* (2013.01)

(58) Field of Classification Search
CPC ............ H01L 29/66795; H01L 29/785; H01L 21/30604; H01L 21/7624; H01L 21/823431; H01L 21/845; H01L 27/1211
See application file for complete search history.

(56) References Cited

U.S. PATENT DOCUMENTS

| | | |
|---|---|---|
| 6,583,015 B2 | 6/2003 | Fitzgerald et al. |
| 6,921,700 B2 | 7/2005 | Orlowski et al. |

(Continued)

OTHER PUBLICATIONS

Orlowski et al., "Si, SiGe, Ge, and III-V Semiconductor Nanomembranes and Nanowires Enabled by SiGe Epitaxy", ECS Transactions, 33 (6) pp. 777-789 (2010).

*Primary Examiner* — William Coleman
(74) *Attorney, Agent, or Firm* — Yuanmin Cai; Andrew M. Calderon; Roberts Mlotkowski Safran & Cole, P.C.

(57) ABSTRACT

A semiconductor device includes an insulator formed within a void to electrically isolate an active fin from an underlying substrate. The void is created by removing a sacrificial portion formed between the substrate and the active fin. The sacrificial portion may be doped to allow for a greater thickness relative to an un-doped portion of substantially similar composition. The doped sacrificial portion thickness may be between 10 nm and 250 nm. The thicker sacrificial portion allows for a thicker insulator so as to provide adequate electrical isolation between the active fin and the substrate. During formation of the void, the active fin may be supported by a gate. The semiconductor structure may also include a bulk region that has at least a maintained portion of the sacrificial portion material.

17 Claims, 5 Drawing Sheets

(56) References Cited

U.S. PATENT DOCUMENTS

| | | |
|---|---|---|
| 7,101,742 B2 | 9/2006 | Ko et al. |
| 7,384,830 B2 * | 6/2008 | Cohen ............. H01L 21/823412 257/E21.618 |
| 7,485,520 B2 * | 2/2009 | Zhu .................. H01L 29/66795 257/E21.301 |
| 7,518,195 B2 | 4/2009 | Ernst et al. |
| 7,646,068 B2 | 1/2010 | Ko et al. |
| 7,867,860 B2 | 1/2011 | Huang et al. |
| 7,888,201 B2 | 2/2011 | Yeo et al. |
| 7,989,296 B2 | 8/2011 | Lee et al. |
| 8,017,463 B2 * | 9/2011 | Chang ............... H01L 29/66795 257/E21.409 |
| 8,211,772 B2 * | 7/2012 | Kavalieros ........ H01L 29/66795 257/E21.409 |
| 8,729,607 B2 | 5/2014 | Itokawa et al. |
| 8,759,943 B2 * | 6/2014 | Tseng ............... H01L 29/66795 257/513 |
| 8,847,281 B2 * | 9/2014 | Cea ................... H01L 29/66545 257/192 |
| 8,912,602 B2 * | 12/2014 | Hsu .................. H01L 29/66795 257/347 |
| 9,006,077 B2 * | 4/2015 | Akarvardar ....... H01L 21/76264 438/156 |
| 2004/0063286 A1 | 4/2004 | Kim et al. |
| 2005/0230763 A1 | 10/2005 | Huang et al. |
| 2010/0219459 A1 | 9/2010 | Orlowski et al. |
| 2012/0064855 A1 * | 3/2012 | Mendelson .......... G01C 21/206 455/404.2 |
| 2013/0056802 A1 | 3/2013 | Cheng et al. |
| 2013/0313649 A1 | 11/2013 | Basker et al. |
| 2013/0320429 A1 | 12/2013 | Thomas |
| 2014/0070328 A1 * | 3/2014 | Goto ................ H01L 21/823431 257/401 |
| 2014/0084351 A1 * | 3/2014 | Huang .............. H01L 29/66477 257/288 |
| 2015/0064855 A1 * | 3/2015 | Cheng ............... H01L 21/76283 438/157 |

* cited by examiner

SILICON-ON-NOTHING FINFETS

FIELD OF THE INVENTION

Embodiments of invention generally relate to FinFET devices, and more particularly to the formation of, and semiconductor structures utilizing, silicon-on-nothing (SON) FinFETs.

DESCRIPTION OF THE RELATED ART

Known SON approaches have been used to form Silicon-on-insulator (SOI) like FinFETs on a bulk substrate. A drawback of conventional SON approaches is that the insulator thickness is governed by the thickness of an original thin SiGe layer (e.g. approximately 25 nm). The thickness of the thin SiGe layer is typically less than a critical thickness needed to ensure that no defects form. For example, the resulting thin insulator creates subsequent challenges in FinFET fabrication such as shorts developing between the fin and the substrate when the thin insulator is etched. Further, the thickness of the original SiGe layer cannot simply be increased by reducing the relative percentage of Ge, since doing so would reduce etch selectivity between SiGe and Si, causing further FinFET fabrication challenges.

Accordingly there is a need for SON FinFETs where the insulator thickness is increased relative to the known SON approaches so as to advantageously provide electrical isolation between the fins and the substrate.

SUMMARY OF THE INVENTION

Embodiments of invention generally relate to FinFET devices, and more particularly to the formation of semiconductor structures comprising SON FinFETs where the insulator is of a thickness to isolate the fins and the substrate.

In an embodiment of the present invention, a method of fabricating a semiconductor device includes forming an sacrificial portion upon a substrate, forming a fin portion upon the sacrificial portion, creating a void by removing the sacrificial portion between the substrate and the fin portion, and forming an insulator within the void, the insulator electrically isolating the fin portion from the substrate.

In another embodiment of the present invention, a semiconductor device includes a replacement insulator fin portion within a void between an active fin portion and a substrate that electrically isolates the active fin portion from the substrate, wherein the void is created by removing a sacrificial fin portion.

In yet another embodiment of the present invention, the semiconductor device is included in a design structure embodied in a machine readable storage medium for designing, manufacturing, or testing an integrated circuit.

These and other features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION OF THE EMBODIMENTS

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to FinFET devices, and more particularly to the formation of, and structures utilizing SON FinFETs. A FinFET device may include a plurality of fins formed in a wafer and a gate covering a portion of the fins. The portion of the fins covered by the gate may serve as a channel region of the device. Portions of the fins may also extend out from under the gate and may serve as source and drain regions of the device. Typical integrated circuits may be divided into active areas and non-active areas. The active areas may include FinFET devices. Each active area may have a different pattern density, or a different number of FinFET devices.

Referring now to FIGS., exemplary process steps of forming a structure 100 in accordance with embodiments of the present invention are shown, and will now be described in greater detail below. It should be noted that some of the FIGS. depict a cross section view of structure 100 having a plurality of fins formed in a semiconductor substrate or bulk. Furthermore, it should be noted that while this description may refer to some components of the structure 100 in the singular tense, more than one component may be depicted throughout the figures and like components are labeled with like numerals. The specific number of fins depicted in the figures and the particular orientation of the cross section views were chosen for illustrative purposes only.

Figure 1:
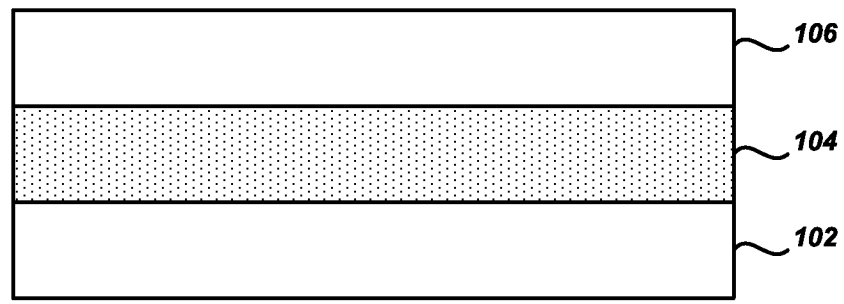
FIGS. 1-3 depict cross section views of a semiconductor structure at intermediate steps of a process flow, in accordance with various embodiments of the present invention.

Referring now to FIG. 1, a cross section view of structure 100 is shown at an intermediate step during a process flow. At this step of fabrication, structure 100 may generally include substrate 102, sacrificial layer 104, and device layer 106.

Substrate 102 and device layer 106 may include either identical or different semiconducting materials with respect to chemical composition, dopant concentration and crystallographic orientation. Preferably, substrate 102 and device layer 106 are silicon (e.g. undoped Si, n-doped Si, p-doped Si, single crystal Si, etc.). For clarity, the material of substrate 102 and device layer 106 will be further referred to as silicon.

Generally, substrate 102 is a base layer of structure 100 wherein further layers are formed thereupon. In certain embodiments, substrate 102 is a silicon wafer. Substrate 102 may be about, but not limited to, several hundred microns thick. For example, substrate 102 may have a thickness ranging from 0.5 mm to about 1.5 mm.

Sacrificial layer 104 is a layer of structure 100 that supports device layer 106 and is sacrificed, or removed, in later FinFET fabrication processes. It is preferable that sacrificial layer 104 be a material such that the sacrificial layer 104 may be removed selective to substrate 102 and device layer 106. By way of the example, sacrificial layer 104 may be carbon-doped SiGe (SiGe:C) since SiGe:C may be etched selective to silicon such that sacrificial layer 104 maybe etched whilst at least portions of silicon substrate 102 and device layer 106 remain. An additional advantage of SiGe:C is achieved because carbon reduces strain as further described herein. As such, it is preferable that sacrificial layer is SiGe:C. Therefore, the material of sacrificial layer 104 will be further referred to as SiGe:C, though it is intended sacrificial layer 104 may be other similar materials without deviating from the spirit of those embodiments herein claimed.

Sacrificial layer 104 may be about 20 to 250 nm thick and may depend upon on the critical thickness of the strain compensated effective SiGe concentration. SiGe that is pseudomorphically grown on silicon is strained due to the relatively larger size of the Ge atom. By doping the SiGe with Carbon, a relatively smaller atom, the strain is effectively reduced.

For example, sacrificial layer 104 may be a thickness greater than 25 nm. Preferably, the thickness of sacrificial layer 104 is greater than or equal to an isolative thickness necessary for electrical isolation between device layer 106 and the underlying substrate 102 when separated by dielectric. In a specific FinFET device, for example, an isolative thickness may be 50 nm to achieve adequate electrical isolation between device layer 106 and substrate 102 when separated by a particular dielectric. In this example, sacrificial layer 104 should therefore be 50 nm. A 50 nm thick sacrificial layer 104 may be formed by doping SiGe (45% Ge) with 1.7% carbon. Without the carbon doping, only 25 nm SiGe (45% Ge) can be formed without relaxation. Therefore, by adding 1.7% carbon, the SiGe (45% Ge) layer thickness can be doubled to 50 nm whilst staying in the metastable regime without relaxation. So the example of SiGe:C (45% Ge, 1.7% C) has roughly the same strain as SiGe (28% Ge) without carbon. The SiGe (28% Ge) layer and the SiGe:C layer (45% Ge, 1.7% C) may be grown metastable, for example, up to 100 nm. On the other hand, a SiGe layer (45% Ge) with no carbon doping, can be grown, for example, up to 25 nm. Generally, sacrificial layer 104 may be formed upon substrate 102 using widely known techniques. For example, sacrificial layer 104 may be epitaxially grown upon substrate 102.

The terms epitaxial growth, grown, deposition, formed etc. mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in forming the carbon doped epitaxial semiconductor material of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the carbon doped epitaxial semiconductor material typically ranges from 550° C. to 900° C. Although higher temperature typically results in faster deposition, the faster deposition may result in crystal defects and film cracking.

A number of different sources may be used for the deposition of the carbon doped epitaxial semiconductor material. In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used. A carbon-doped silicon germanium layer may be formed by adding a carbon gas source such as monomethylsilane to the silicon and germanium gas source mixture.

Generally, device layer 106 is a foundational layer for the formation of FinFET device fins. For example, device layer 106 is the layer that the FinFET fins are cut (e.g. by sidewall imaging transfer (SIT), etc.) or otherwise formed from. Device layer 106 may have a thickness ranging from about 5 nm to about 100 nm. Device layer 106 may be formed upon sacrificial layer 104 using widely known techniques. For example, device layer 106 may be epitaxially grown upon sacrificial layer 106.

Figure 2:
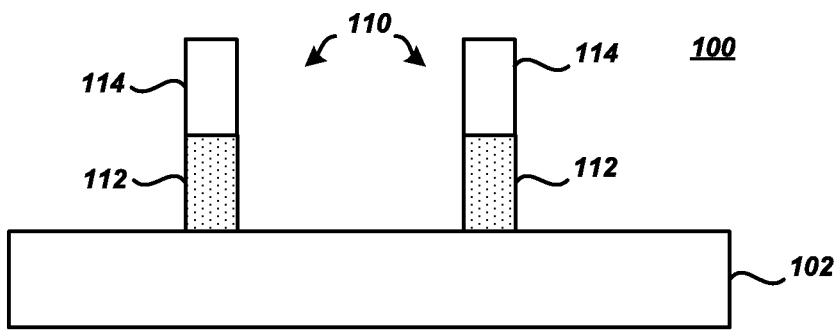

Referring now to FIG. 2, a cross section view of structure 100 is shown at an intermediate step during a process flow. At this step of fabrication, fins 110 are formed in structure 100, according to various embodiments of the present invention. Generally, fins 110 may be formed using widely known techniques. For example, fins 110 may be formed by sidewall imaging transfer (SIT) processes. In a STI process, a poly silicon mandrel is created and spacers wrapping around the mandrel are formed. The spacers are used as masks to open lower layer(s). Remaining spacers are etched off to reduce topography, and a resist mask is processed to expose undesirable parts of the spacer masks. Using resist masks, the undesirable parts of the spacer masks are removed. The resist masks are stripped. Then, the spacer masks are employed to etch or remove portions of sacrificial layer 104 and device layer 106 thus leaving the plurality of fins 110. In the example shown in FIG. 2, fins 110 will include sacrificial portions 112 and fin portions 114. Sacrificial portions 112 are the portion of fins 110 that remain from sacrificial layer 104 after fin formation. Fin portions 114 are the portion of fins 110 that remain from the device layer 106. Generally, fins 110 may be formed by other known processes without deviating from the spirit of those embodiments herein claimed.

Figure 3:
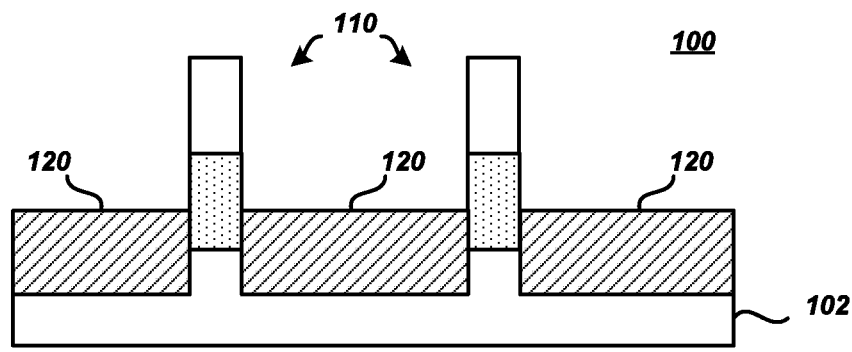

Referring now to FIG. 3, a cross section view of structure 100 is shown at an intermediate step during a process flow. At this step of fabrication, isolation portions 120 are formed in structure 100, according to various embodiments of the present invention. Generally, isolation portions 120 may be formed using widely known techniques. For example, a blanket layer of oxide or other dielectric is deposited on the structure shown in FIG. 2. Subsequently, CMP processes to the top surface of the fins 110 remove excess material. To form isolation portions 120, the oxide or other such dielectric is further recess between fins 110 leaving some the oxide or other such dielectric, thereby forming isolation portions 120. isolation portions 120 allow different areas of substrate 102 to be electrically isolated from one another. Generally, isolation portions 120 may be formed by other known processes without deviating from the spirit of those embodiments herein claimed.

Figure 4:
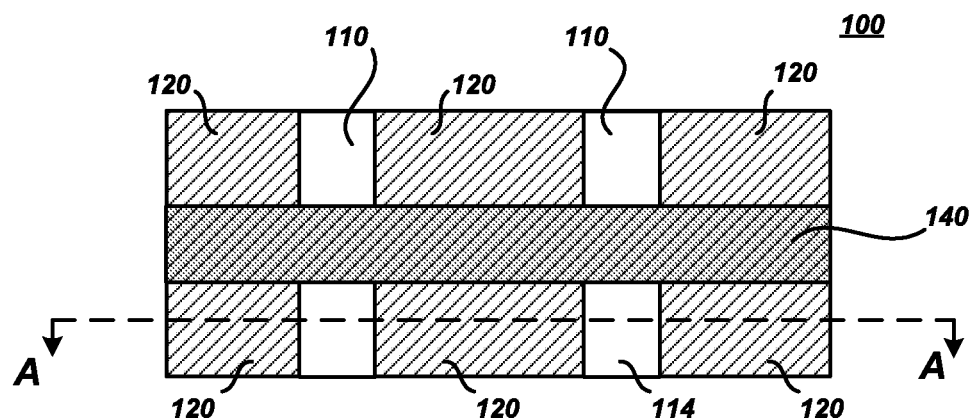
FIG. 4 depicts a top view of a semiconductor structure at an intermediate step of a process flow, in accordance with various embodiments of the present invention.
Figure 5:
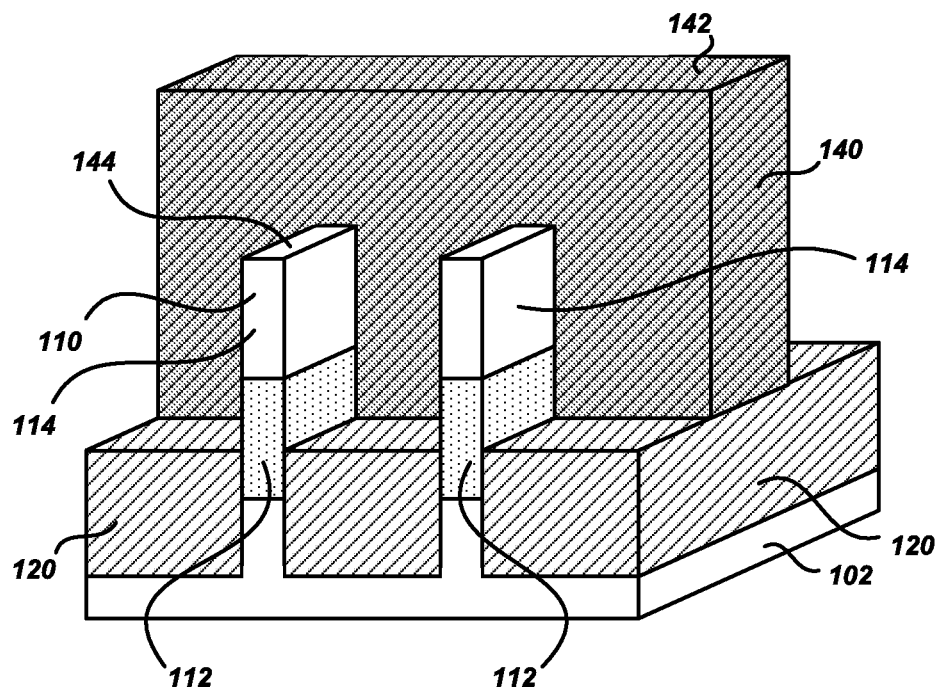
FIG. 5 depicts an isometric view of a semiconductor structure at an intermediate step of a process flow, in accordance with various embodiments of the present invention.

Referring now to FIG. 4, a top view of structure 100, and FIG. 5, an isometric view of structure 100, both shown at an intermediate step during a process flow. At this step of fabrication, dummy gate 140 is formed in structure 100, according to various embodiments of the present invention. As shown, the dummy gate 140 is formed in a central portion across the fins 110. The dummy gate 140, which is orthogonal to the fins 110, serves to support fin portion 114 in subsequent FinFET fabrication processes where sacrificial portion 112 is removed. Dummy gate 140 is similarly removed in subsequent FinFET fabrication steps and therefore may include polysilicon or other similar sacrificial material. Generally, dummy gate 140 may be formed by using widely known techniques. For example, dummy gate 140 may be formed by first providing a layer of polysilicon atop structure 100 shown in FIG. 3 utilizing a conventional deposition process including, for example, chemical vapor deposition, plasma enhanced chemical vapor deposition or chemical solution deposition. The layer of dummy gate material may then patterned by lithography and etched to form dummy gate 140 as shown in FIG. 4 and FIG. 5. Generally, dummy gate 140 may be formed by other known processes without deviating from the spirit of those embodiments herein claimed. In certain embodiments, a spacer is subsequently formed around dummy gate 140 utilizing known techniques.

In some embodiments, a top surface 142 of dummy gate 140 may be co-planar with at least one top surface 144 of fins 110. In other embodiments, the top surface 142 of dummy gate 140 may be below at least one top surface 144 of fins 110, or the top surface 142 of dummy gate 140 may be above at least one top surface 144 of fins 110 as is shown in FIG. 5.

Figure 6:
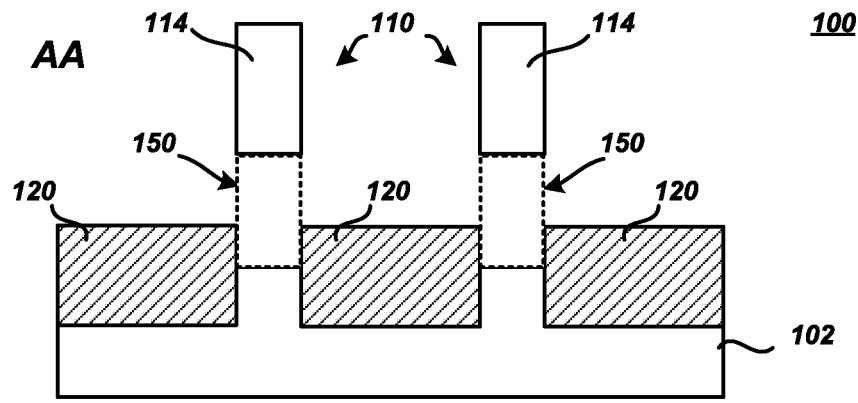
FIGS. 6-9 depict cross section views of a semiconductor structure at intermediate steps of a process flow, in accordance with various embodiments of the present invention.

Referring now to FIG. 6, cross section view "AA" of structure 100 is shown at an intermediate step during a process flow. At this step of fabrication, sacrificial portions 112 are removed, thereby forming voids 150 under fin portions 114, according to various embodiments of the present invention.

Generally, sacrificial portions 112 may be removed using widely known techniques wherein sacrificial portions 112 are removed selective to the materials of substrate 102, fin portions 114, and isolation portions 120. For example, SiGe:C sacrificial portions 112 may be etched with Hydrogen Chloride (HCl) selective to Si fin portions 114 and STI oxide isolation portions 120. In a non-limiting example, the HCl etch can be performed in an epitaxial reactor with gaseous HCl. As a result, the SiGe:C sacrificial portions 112 are removed from structure 100 and the Si fin portions 114 and STI oxide isolation portions 120 remain. When sacrificial portions 112 are removed from structure 100 voids 150, tunnels, cavities, or other general openings are formed under fin portions 114. When sacrificial portions 112 are removed, fins 110 may be referred to as floating, since fin portions 114 are not supported from underneath. Rather, fin portions 114 are supported by dummy gate 140. Generally, sacrificial portions 112 may be removed by other known processes without deviating from the spirit of those embodiments herein claimed.

Figure 7:
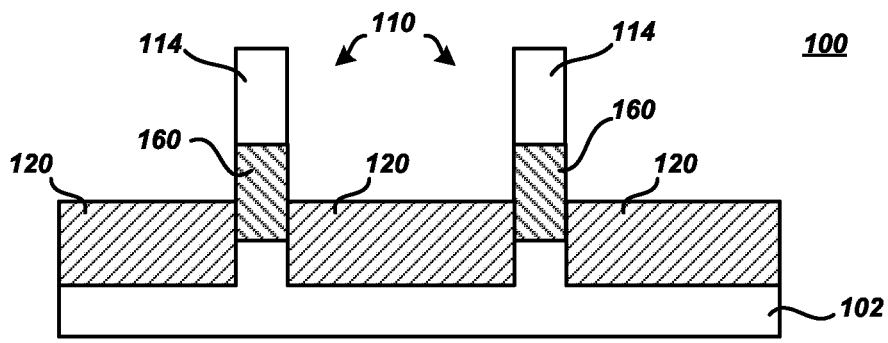

Referring now to FIG. 7, a cross section view of structure 100 is shown at an intermediate step during a process flow. At this step of fabrication, insulator portions 160 are formed within voids 150, according to various embodiments of the present invention. Generally, insulator portions 160 may be formed using widely known techniques wherein electrically isolative material is created within voids 150, thereby electrically isolating substrate 102 from fin portion 114. For example, a dielectric material (e.g., silicon oxide, silicon nitride, combination of both, etc.) may be backfilled, grown, filled, etc. into voids 150. Generally, insulator portions 160 may be formed by other known processes without deviating from the spirit of those embodiments herein claimed.

Preferably, the thickness of insulator portions 160 is greater than or equal to the isolative thickness necessary for adequate electrical isolation between fin portion 114 and the underlying substrate 102. As indicated above, in a specific FinFET device, the isolative thickness may be 50 nm. Therefore, in this example, the thickness of insulator portions 160 should be 50 nm, so as to achieve adequate electrical isolation between fin portions 114 and the underlying substrate 102. An exemplary factor in determining the isolative thickness is the thickness of insulator portions 160 necessary to prevent shorts from occurring between fin portion 114 and substrate 102. Generally, the thickness of insulator portions 160 is limited by only the thickness of sacrificial layer 104. Therefore, if a designer requires a relatively thicker insulator portion 160 as compared with known SON approaches, he or she may require the semiconductor structure 100 have the required thicker sacrificial layer 104. Advantageously therefore, the designer is not limited to the thin insulator of known SON approaches since the insulator portion 160 thickness may be increased so as to provide electrical isolation between fins portions 114 and substrate 102.

Figure 8:
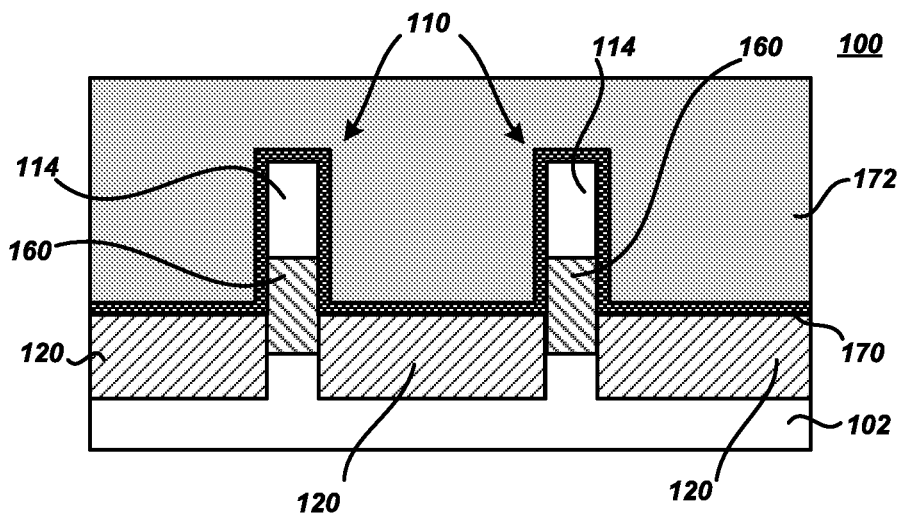

Referring now to FIG. 8, a cross section view of structure 100 is shown at an intermediate step during a process flow. At this step of fabrication one or more processes occur so as to complete FinFET fabrication, according to various embodiments of the present invention. For example, a high-k layer 170 and a conductive gate 172 are formed.

High-k layer 170 is generally a dielectric material having a dielectric constant that is greater than the dielectric constant of silicon oxide, e.g., 3.9. Typically, high-k gate dielectric materials have a dielectric constant greater than 4.0, with a dielectric constant of greater than 8.0 being even more typical. Exemplary high-k dielectric materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered high-k materials can also be employed as the high-k dielectric 170. Generally, high-k dielectric 170 is formed using widely known techniques. For example, high-k dielectric 170 can be formed utilizing a thermal oxidation and/or nitridation process or a deposition method (e.g. chemical vapor deposition (CVD), physical vapor deposition (PVD), molecular beam deposition (MBD), pulsed laser deposition (PLD), liquid source misted chemical deposition (LSMCD), atomic layer deposition (ALD), etc.). Generally high-k dielectric 170 may be formed by other known processes without deviating from the spirit of those embodiments herein claimed.

The gate 172 may be formed above the high-k dielectric 170. The gate 172 that can be employed may comprise any conductive material including, but not limited to, polycrystalline silicon, polycrystalline silicon germanium, an elemental metal (e.g., tungsten, titanium, tantalum, aluminum, nickel, ruthenium, palladium, platinum, etc.), an alloy of at least one elemental metal, an elemental metal nitride (e.g., tungsten nitride, aluminum nitride, and titanium nitride, etc.), an elemental metal silicide (e.g., tungsten silicide, nickel silicide, titanium silicide, etc.) and multilayers thereof. Depending upon structure 100 or location within structure 100, gate 172 can be comprised of a p-type gate metal or gate 172 can be comprised of an n-type gate metal. Gate 172 may be a single layer or multiple layer of conductive material.

The gate 172 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other liked deposition processes. When Si-containing materials are used as the gate 172 material, the Si-containing materials can be doped within an appropriate impurity by utilizing either an in-situ doping deposition process or by utilizing deposition, followed by a step such as ion implantation in which the appropriate impurity is introduced into the Si-containing material. When a metal silicide is formed, a conventional silicidation process can be employed. The gate 172 typically has a thickness from 5 nm to 200 nm, with a thickness from 20 nm to 100 nm being more typical. In some embodiments in which different polarity FETs are formed, the gate conductor material in the different active device regions can be the same or different. Different gate conductive materials can be formed using block mask technology. Generally gate 172 may be formed by other known processes without deviating from the spirit of those embodiments herein claimed.

Figure 9:
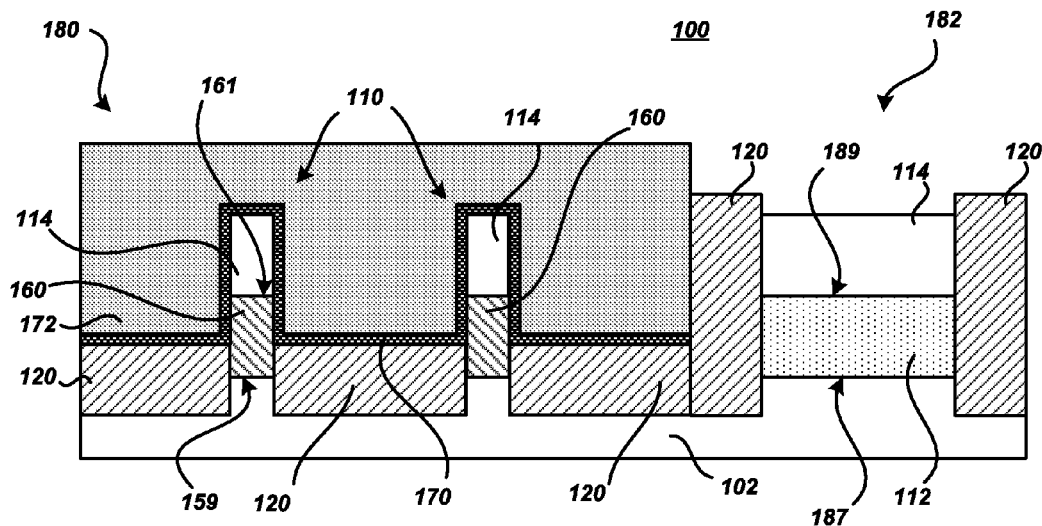

Referring now to FIG. 9, a cross section view of structure 100 is shown. In the present embodiment, structure 100 includes SON region 180 and bulk region 182. SON region 180 is the circuit area of structure 100 wherein at least of the SON FinFET fabrication process herein described were utilized. SON region 180 at least includes insulator portion 160 of a increased thickness relative to known SON approaches that provides electrical isolation between fins portions 114 and substrate 102. Bulk region 182 is the circuit area of structure 100 outside SON region 180. Bulk region 102 may be typically used for forming auxiliary devices such as electrostatic discharge (ESD) protection devices, etc.

In the example shown in FIG. 9, bulk region 182 includes sacrificial portion 112. That is, the sacrificial portion 112 included in bulk region 182 of structure 100 may not be removed by auxiliary device fabrication processes. In this embodiment, the sacrificial portions 112 included in bulk region 182 are maintained. In certain embodiments a top surface 189 of bulk region 182 sacrificial portion 112 is co-planar with a top surface 161 of at least one insulator portion 160. In certain embodiments a bottom surface 187 of bulk region 182 sacrificial portion 112 is co-planar with a bottom surface 159 of at least one insulator portion 160.

Though no subsequent steps of a process flow are shown, it is to be understood that semiconductor structure 100 may undergo further Front End of the Line, Middle End of the Line, and/or Back End of the Line fabrication stages to form a semiconductor device.

Figure 10:
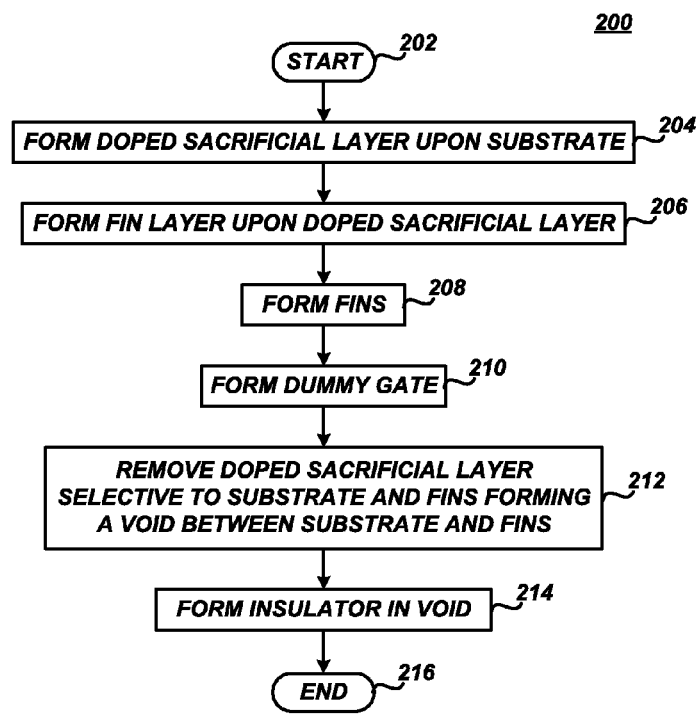
FIG. 10 depicts a process of forming a semiconductor structure, in accordance with various embodiments of the present invention

Referring now to FIG. 10, a process 200 of forming a semiconductor structure is shown. Process 200 begins at block 202. Process 200 continues by forming a doped sacrificial layer 104 upon substrate 102 (block 204). A doped sacrificial layer 104 may be formed upon substrate 102 by, for example, epitaxially growing a carbon doped sacrificial layer 104 made of SiGe:C (45% Ge, 1.7% C) upon a silicon substrate 102. Doped sacrificial layer 104 is formed upon substrate 102 to a thickness greater than or equal to an isolative thickness necessary for adequate electrical isolation between device layer 106 and the underlying substrate 102 when separated by an insulator. In a specific embodiment, for example, the doped sacrificial layer is formed upon substrate 102 to a thickness greater than 25 nm. In other embodiments, the doped sacrificial layer is formed upon substrate 102 to a thickness of 50 nm.

Process 200 continues by forming device layer 106 upon the doped sacrificial layer 104 (block 206). Device layer 106 may be formed upon sacrificial layer 104 by, for example, epitaxially growing a silicon device layer 106 upon a SiGe:C sacrificial layer 106. Device layer 106 may be formed to a thickness ranging from about 5 nm to about 100 nm.

Process 200 continues by forming fins 110 (block 208). Fins 110 may be formed by, for example, SIT processes wherein portions of doped sacrificial layer 104 and device layer 106 removed thereby resulting in the formation of the plurality of fins 110. In certain embodiments, the formation of fins 110 will result in fins 100 that include sacrificial portions 112 and fin portions 114. Sacrificial portions 112 are the portion of fins 110 that remain from doped sacrificial layer 104. Fin portions 114 are the portion of fins 110 that remain from device layer 106.

Process 200 continues by forming a dummy gate 140 (block 210). Dummy gate 140 may be formed by, for example, providing a layer of polysilicon, deposition, patterning, and etching. Dummy gate 140 may be formed in a central portion across the fins 110. The dummy gate 140, which is orthogonal to the fins 110, is formed to support fin portion 114 when sacrificial portion 112 is later removed. Dummy gate 140 may be formed with polysilicon or other related sacrificial material. In some embodiments, dummy gate 140 may be formed so that top surface 142 is co-planar with at least one top surface 144 of fins 110. In other embodiments, dummy gate 140 may be formed so that the top surface 142 is below at least one top surface 144 of fins 110, or so that the top surface 142 may be above at least one top surface 144 of fins 110.

Process 200 continues by removing at least portions (e.g. sacrificial portions 112, etc.) of the doped sacrificial layer 104 selective to substrate 102 and fin layer 104 thereby forming a void 150 between substrate 102 and fin layer 104 (block 212). Doped sacrificial layer 104 portions may be removed by, for example, etching the SiGe:C sacrificial portions 112 with Hydrogen Chloride (HCl) selective to Si fin portions 114. In this exemplary result, the SiGe:C sacrificial portions 112 are removed and the Si fin portions 114 remain. When the doped sacrificial layer 104 portions are removed, voids 150, tunnels, cavities, or other such openings are formed under fin portions 114. As such, fins 110 may be referred to as floating since fin portions 114 are not supported from underneath but are supported by dummy gate 140.

Process 200 continues by forming insulator portions 160 within voids 150 (block 214). Insulator portions 160 may be formed within voids 150 by, for example, filling, growing, backfilling, etc. a dielectric material (e.g., silicon oxide, silicon nitride, etc.) into voids 150. Preferably, insulator portions 160 are formed to have a thickness greater than or equal to the isolative thickness necessary for adequate electrical isolation between fin portion 114 and the underlying substrate 102 as is described herein. Process 200 ends at block 216.

Figure 11:
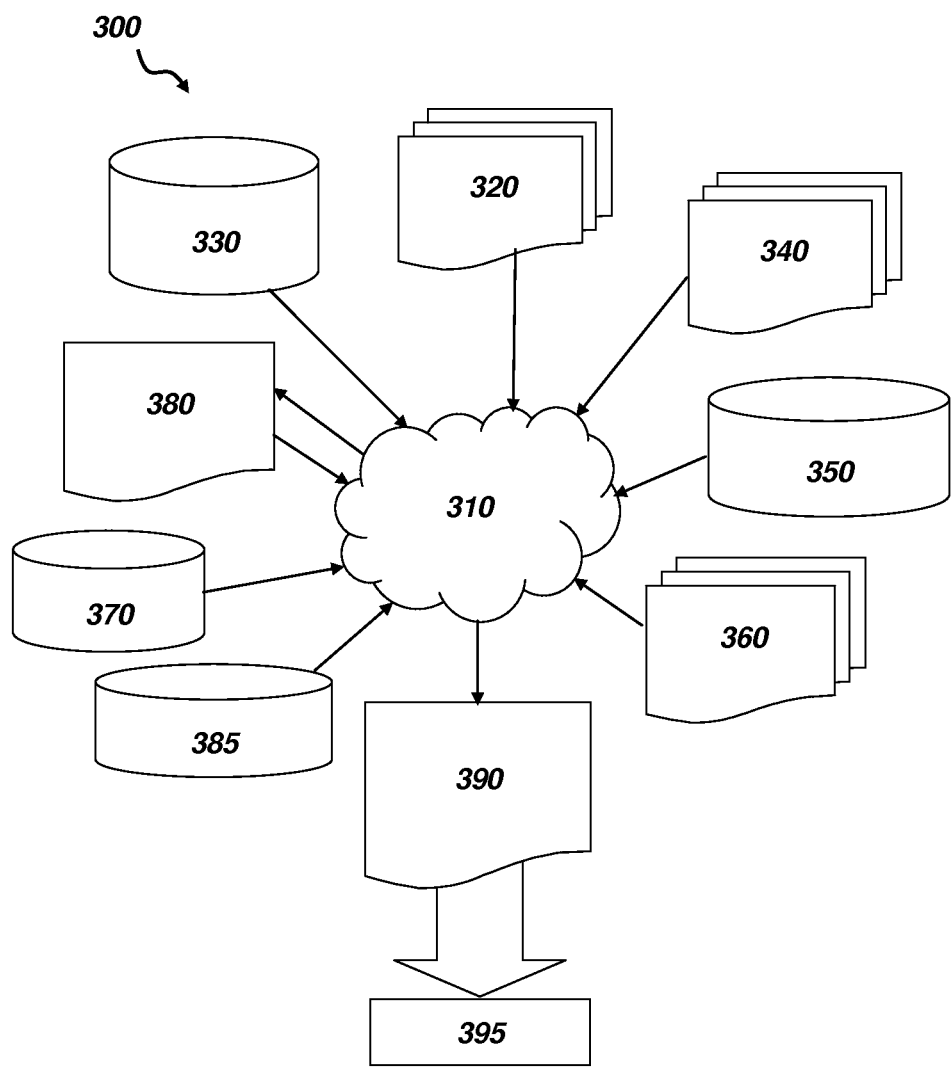
FIG. 11 depicts a flow diagram of a design process used in semiconductor design, manufacture, and/or test, in accordance with various embodiments of the present invention.

Referring now to FIG. 11, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 1-9.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 1-9. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 1-9 to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 390 may comprise a compiled, executable HDL simulation model that functionally simulates the devices shown in FIGS. 1-9.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

References herein to terms such as "vertical", "horizontal", etc. are made by way of example, and not by way of limitation, to establish a frame of reference. The term "horizontal" as used herein is defined as a plane parallel to the conventional plane or surface of substrate, regardless of the actual spatial orientation of semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A method of fabricating a semiconductor device, the method comprising:
    forming an sacrificial portion upon a substrate;
    forming a fin portion upon the sacrificial portion;
    creating a void by removing the sacrificial portion between the substrate and the fin portion, and;
    forming an insulator within the void, the insulator electrically isolating the fin portion from the substrate,
    wherein the sacrificial portion is doped to allow for a thicker sacrificial portion relative to an un-doped sacrificial portion of substantially similar composition.

2. The method of claim 1, wherein forming a fin portion further comprises:
    forming epitaxial silicon portion on the sacrificial portion.

3. The method of claim 1 further comprising:
    forming a gate to support the fin portion prior to creating the void.

4. The method of claim 1 wherein the doped sacrificial layer has a thickness between 10 and 250 nm.

5. The method of claim 2 further comprising:
    patterning an epitaxial sacrificial layer and an epitaxial silicon layer to form the fin portion and the sacrificial portion.

6. The method of claim 5 further comprising:
    maintaining a segment of the sacrificial layer in a bulk region.

7. A semiconductor device comprising:
    a replacement insulator fin portion within a void between an active fin portion and a substrate that electrically isolates the active fin portion from the substrate, wherein the void is created by removing a sacrificial fin portion; and
    a gate over the active fin portion, wherein the gate is a dummy gate.

8. The semiconductor device of claim 7, wherein the active fin portion is an epitaxially grown silicon portion.

9. The semiconductor device of claim 7, wherein sacrificial fin portion is doped to allow for a thicker sacrificial fin portion relative to an un-doped sacrificial fin portion of substantially similar composition.

10. The semiconductor device of claim 7, wherein the sacrificial fin portion has a thickness between 10 and 250 nm.

11. The semiconductor device of claim 7, further comprising:
    a bulk region comprising a maintained portion of doped sacrificial material associated with the sacrificial fin portion.

12. A design structure embodied in a machine readable storage medium for designing, manufacturing, or testing an integrated circuit, the design structure comprising:
    a replacement insulator fin portion within a void between an active fin portion and a substrate that electrically isolates the active fin portion from the substrate, wherein the void is created by removing a sacrificial fin portion.

13. The design structure of claim 12, wherein the active fin portion is an epitaxially grown silicon portion.

14. The design structure of claim 12, further comprising a gate over the active fin portion.

15. The design structure of claim 12, wherein the sacrificial fin portion has a thickness between 10 and 250 nm.

16. The design structure of claim 12, further comprising:
    a bulk region comprising a maintained portion of doped sacrificial material associated with the sacrificial fin portion.

17. The design structure of claim 14, wherein the gate is a dummy gate.

* * * * *